(12) United States Patent
Hsieh

(10) Patent No.: US 7,777,327 B2
(45) Date of Patent: Aug. 17, 2010

(54) CHIP PACKAGE STRUCTURE AND CIRCUIT BOARD THEREOF

(75) Inventor: Ching-Chun Hsieh, Kaohsiung County (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 0 days.

(21) Appl. No.: 11/777,738

(22) Filed: Jul. 13, 2007

(65) Prior Publication Data

US 2008/0042256 A1 Feb. 21, 2008

(30) Foreign Application Priority Data

Aug. 15, 2006 (TW) .............................. 95129848 A

(51) Int. Cl.
*H01L 23/04* (2006.01)
(52) U.S. Cl. ................ 257/698; 257/690; 257/E23.124
(58) Field of Classification Search ................. 257/690, 257/698, E23.124
See application file for complete search history.

(56) References Cited

U.S. PATENT DOCUMENTS

| | | | | |
|---|---|---|---|---|
| 6,617,524 B2* | 9/2003 | Vo | ............................. | 174/260 |
| 6,692,988 B2* | 2/2004 | Fang et al. | .................. | 438/112 |
| 6,835,897 B2* | 12/2004 | Chang et al. | ................. | 174/255 |
| 7,141,868 B2* | 11/2006 | Liao et al. | .................... | 257/667 |
| 7,417,329 B2* | 8/2008 | Chuang et al. | .............. | 257/786 |
| 2005/0073038 A1* | 4/2005 | Kuo et al. | .................... | 257/690 |

FOREIGN PATENT DOCUMENTS

TW 200514221 4/2005

\* cited by examiner

*Primary Examiner*—Bradley K Smith
*Assistant Examiner*—Marvin Payen
(74) *Attorney, Agent, or Firm*—J.C. Patents

(57) ABSTRACT

A chip package structure including a substrate, a circuit layer, a solder mask, a chip, and an encapsulant is provided. The circuit layer is disposed on the substrate and includes two traces and a dummy trace. The dummy trace is disposed between the traces. The solder mask covers the circuit layer and the substrate. The chip is disposed on the solder mask and electrically connected to the traces. The encapsulant covers the solder mask and wraps the chip. The traces and the dummy trace extend from the inside of the area covered by the encapsulant to the outside of the area covered by the encapsulant. Because the dummy trace is used in the chip package structure, it can be avoided that the traces is pulled apart when the redundant encapsulant is removed after the encapsulant is formed.

2 Claims, 6 Drawing Sheets

CHIP PACKAGE STRUCTURE AND CIRCUIT BOARD THEREOF

CROSS-REFERENCE TO RELATED APPLICATION

This application claims the priority benefit of Taiwan application serial no. 95129848, filed on Aug. 15, 2006. All disclosure of the Taiwan application is incorporated herein by reference.

BACKGROUND OF THE INVENTION

1. Field of the Invention

The present invention relates to a chip package structure and a circuit board thereof, and more particularly to a chip package structure and a circuit board thereof capable of resisting stress generated when removing a redundant encapsulant.

2. Description of Related Art

In modern life with progressing science and technology, 3C electronic products are widely used in people's life. The electronic products are developed towards the trend of being light, thin, short and small along with the increasing progress of the trend. When the demand of people for electronic products increases, diverse peripheral components of the electronic products are emerged, in which circuit board is one of the indispensable components.

FIG. 1A is a schematic sectional view of a conventional chip package structure having a printed circuit board (PCB), and FIG. 1B is a schematic top view of a corner of the PCB in FIG. 1A. Referring to FIGS. 1A and 1B, the chip package structure 100 includes a PCB 160, a chip 140, and an encapsulant 150. The PCB 160 includes a substrate 110, a circuit layer 120, and a solder mask 130. The circuit layer 120 is disposed on the substrate 110, and includes a plurality of traces 122 and a plurality of via holes 124. The solder mask 130 covers the circuit layer 120 and the substrate 110, and has an encapsulant disposing area 132 for carrying the encapsulant 150. The traces 122 extend from the inside of the encapsulant disposing area 132 to the outside of the encapsulant disposing area 132. The chip 140 is located on the solder mask 130, and electrically connected to the trace 122. The encapsulant 150 covers the encapsulant disposing area 132 of the solder mask 130, and wraps the chip 140.

After forming the encapsulant 150, the redundant encapsulant 150 must be removed, and such removing action generates a stress on the trace 122 under the encapsulant 150. The trace 122 at the corner of the encapsulant disposing area 132 is located at a position where the stress is concentrated, and thus is easily to be pulled apart by the stress, which causes a decreased yield and poorer product reliability.

In order to reduce the probability of the trace being pulled apart by the stress, another conventional art provides a method in which no trace is disposed at the corner of the encapsulant disposing area. However, such a method reduces the area on the substrate available for disposing the circuit layer, so that the layout of the trace is more difficult to design.

SUMMARY OF THE INVENTION

The present invention is directed to providing a chip package structure and a circuit board thereof, so as to reduce the probability of the trace being pulled apart by the stress generated when removing redundant encapsulant.

The present invention provides a circuit board, which includes a substrate, a circuit layer, and a solder mask. The circuit layer is disposed on the substrate, and includes two traces and a dummy trace, and the dummy trace is located between the traces. The solder mask covers the circuit layer and the substrate, and has an encapsulant disposing area suitable for carrying an encapsulant. The traces and the dummy trace extend from the inside of the encapsulant disposing area to the outside of the encapsulant disposing area.

In the circuit board according to an embodiment of the present invention, the traces and the dummy trace are located at a corner of the encapsulant disposing area.

In the circuit board according to an embodiment of the present invention, the traces and the dummy trace are located between two adjacent corners of the encapsulant disposing area.

In the circuit board according to an embodiment of the present invention, a material of the dummy trace is the same as a material of the traces, and the dummy trace is electrically isolated from the traces.

The present invention further provides a circuit board, which includes a substrate, a circuit layer, and a solder mask. The circuit layer is disposed on the substrate, and includes a trace. The trace has an enlarged section, and a line width of the enlarged section is larger than a line width of the other portion of the trace. The solder mask covers the circuit layer and the substrate, and has an encapsulant disposing area for carrying an encapsulant. The enlarged section extends from the inside of the encapsulant disposing area to the outside of the encapsulant disposing area.

In an embodiment of the present invention, the enlarged section is located at a corner of the encapsulant disposing area.

In an embodiment of the present invention, the enlarged section is located between two adjacent corners of the encapsulant disposing area.

The present invention further provides a chip package structure, which includes a substrate, a circuit layer, a solder mask, a chip, and an encapsulant. The circuit layer is disposed on the substrate, and includes two traces and a dummy trace. The dummy trace is located between the two traces. The solder mask covers the circuit layer and the substrate. The chip is located on the solder mask, and electrically connected to the traces. The encapsulant covers the solder mask, and wraps the chip. The traces and the dummy trace extend from the inside of an area covered by the encapsulant to outside of the area covered by the encapsulant.

In the chip package structure according to an embodiment of the present invention, the traces and the dummy trace are located at a corner of the area covered by the encapsulant.

In the chip package structure according to an embodiment of the present invention, the traces and the dummy trace are located between two adjacent corners of the area covered by the encapsulant.

In the chip package structure according to an embodiment of the present invention, a material of the dummy trace is the same as a material of the traces, and the dummy trace is electrically isolated from the traces.

The present invention further provides a chip package structure, which includes a substrate, a circuit layer, a solder mask, a chip, and an encapsulant. The circuit layer is disposed on the substrate, and includes a trace. The trace has an enlarged section, and a line width of the enlarged section is larger than a line width of the other portion of the trace. The solder mask covers the circuit layer and the substrate. The chip is located on the solder mask, and electrically connected to the trace. The encapsulant covers the solder mask and wraps the chip. The enlarged section extends from the inside of an area covered by the encapsulant to the outside of the area covered by the encapsulant.

In an embodiment of the present invention, the enlarged section is located at a corner of the area covered by the encapsulant.

In an embodiment of the present invention, the enlarged section is located between two adjacent corners of the area covered by the encapsulant.

In the chip package structure and circuit board thereof according to the present invention, because a dummy trace or an enlarged section of the trace is used, it can help the trace to resist the stress generated when removing the redundant encapsulant after forming the encapsulant, and reduce the probability of the trace being pulled apart by the stress. Moreover, in the chip package structure according to the present invention, the corner of the area covered by the encapsulant can still be used to dispose the traces. Therefore, compared with the other conventional art, the present invention has a large trace layout space.

In order to make the aforementioned and other objects, features and advantages of the present invention comprehensible, preferred embodiments accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The First Embodiment

Figure 1A:
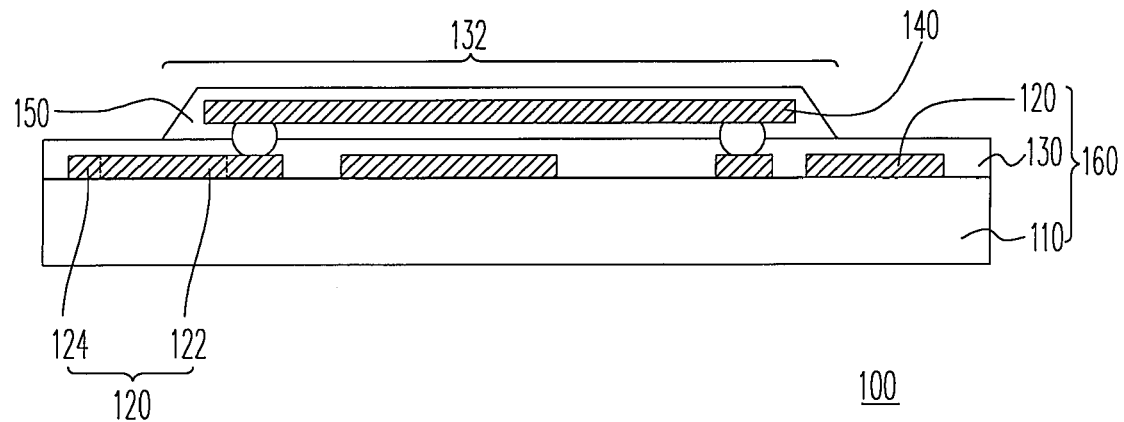
FIG. 1A is a schematic sectional view of a conventional chip package structure having a printed circuit board (PCB).
Figure 1B:
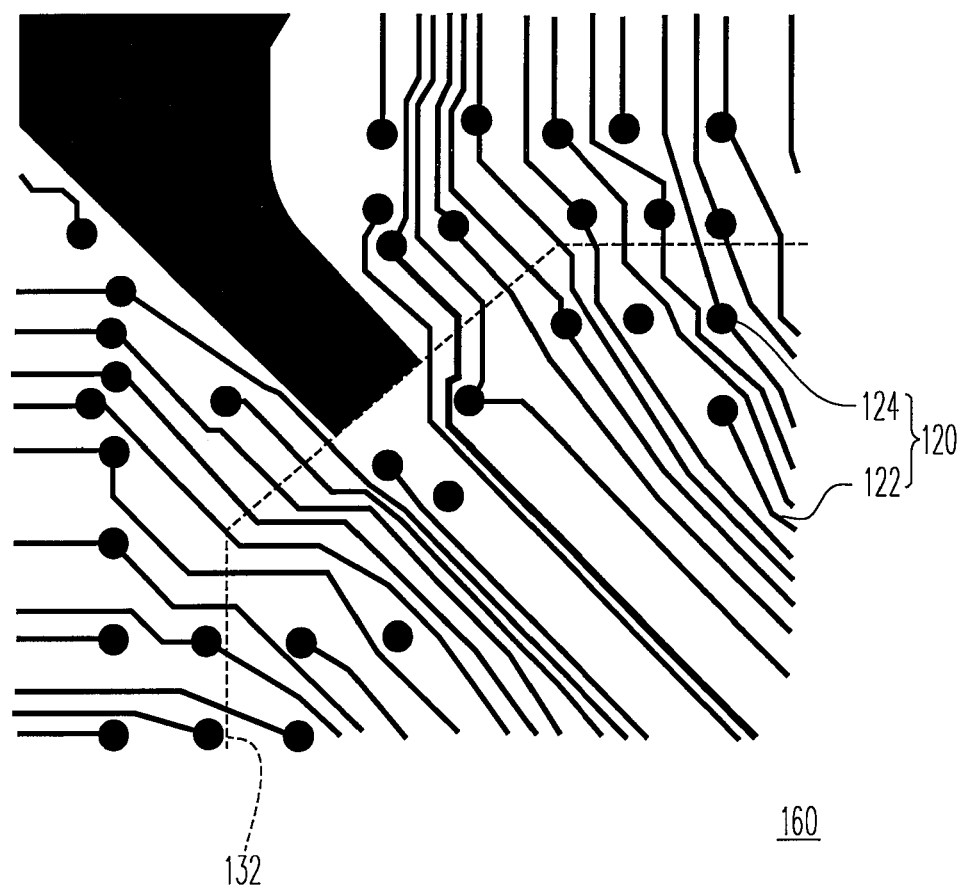
FIG. 1B is a schematic top view of a corner of the PCB in FIG. 1A.
Figure 2A:
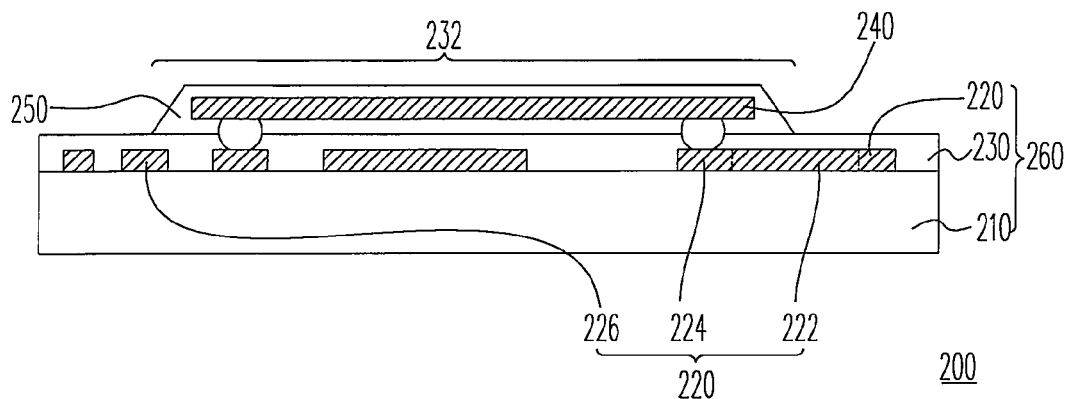
FIG. 2A is a schematic sectional view of a chip package structure having a circuit board according to a first embodiment or a second embodiment of the present invention.
Figure 2B:
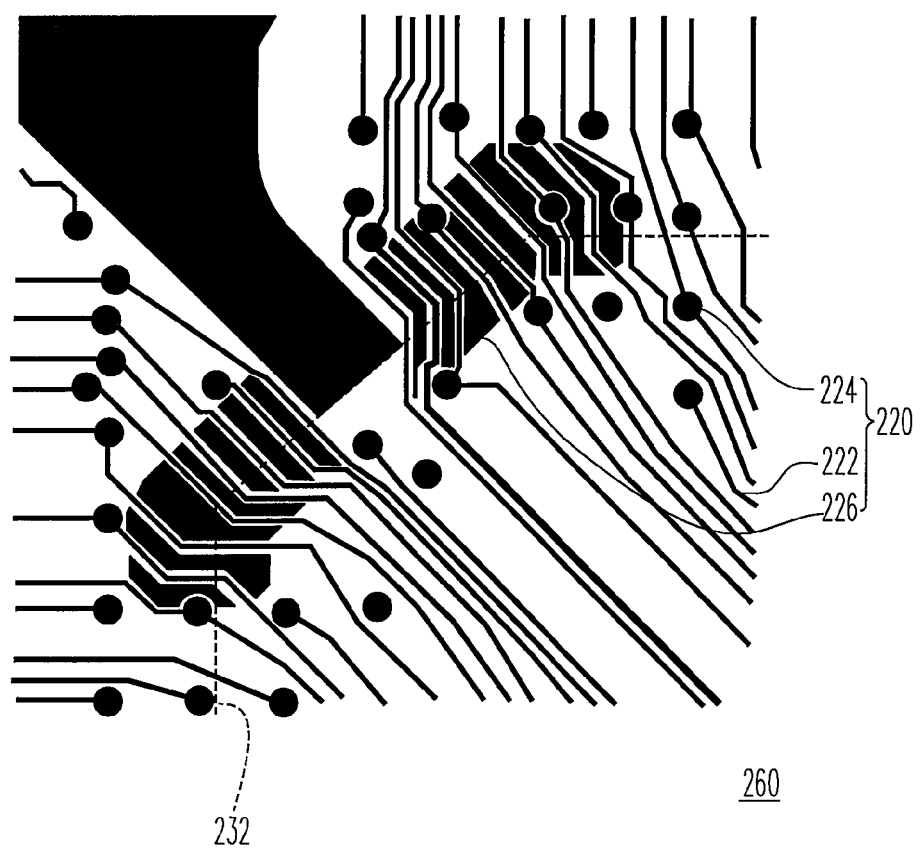
FIG. 2B is a schematic top view of a corner of the circuit board according to the first embodiment of the present invention.

FIG. 2A is a schematic sectional view of a chip package structure having a circuit board according to a first embodiment of the present invention, and FIG. 2B is a schematic top view of a corner of the circuit board according to the first embodiment of the present invention. Referring to FIGS. 2A and 2B, the chip package structure 200 includes a circuit board 260, a chip 240, and an encapsulant 250. The circuit board 260 includes a substrate 210, a circuit layer 220, and a solder mask 230. The circuit layer 220 is disposed on the substrate 210 and includes a plurality of traces 222, a plurality of via holes 224, and a dummy trace 226. The dummy trace 226 is located between two adjacent traces 222, and the dummy trace 226 is electrically isolated from the traces 222 and the via holes 224. Moreover, the materials of the dummy trace 226, the traces 222, and the via holes 224 are, for example, the same conductive material, so as to form the traces 222, the via holes 224, and the dummy trace 226 simultaneously in the same process. The solder mask 230 covers the circuit layer 220 and the substrate 210, and has an encapsulant disposing area 232 for carrying the encapsulant 250. The traces 222 and the dummy trace 226 extend from the inside of the encapsulant disposing area 232 to the outside of the encapsulant disposing area 232. The chip 240 is located on the solder mask 230 and electrically connected to the traces 222. The chip 240 is electrically connected to the traces 222 by means of, for example, flip chip bonding or wire bonding, and the structure shown in FIG. 2A is a structure using flip chip bonding. The encapsulant 250 covers the encapsulant disposing area 232 of the solder mask 230 and wraps the chip 240.

After forming the encapsulant 250, redundant encapsulant 250 must be removed, and such removing action generates a stress on the traces 222 under the encapsulant 250. Particularly, the stress at the corner of the encapsulant disposing area 232 is largest, and the stress at edge of the encapsulant disposing area 232 is lower than the stress at the corner. However, the dummy trace 226 increases the contact area of the circuit layer 220 and the substrate 210, in which the circuit layer 220 is disposed between the encapsulant 250 at the corner or edge of the encapsulant disposing area 232 and the substrate 210, so it helps the traces 222 to resist the stress and reduces the probability of the traces being pulled apart by the stress.

Figure 3A:
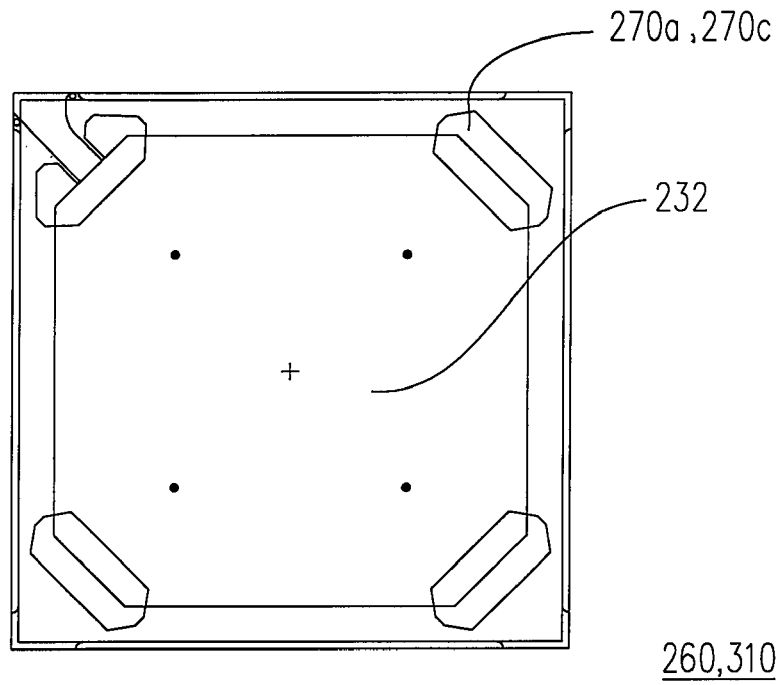
FIGS. 3A and 3B are schematic views of relative positions of various areas in the circuit board according to the first embodiment or the second embodiment of the present invention.
Figure 3B:
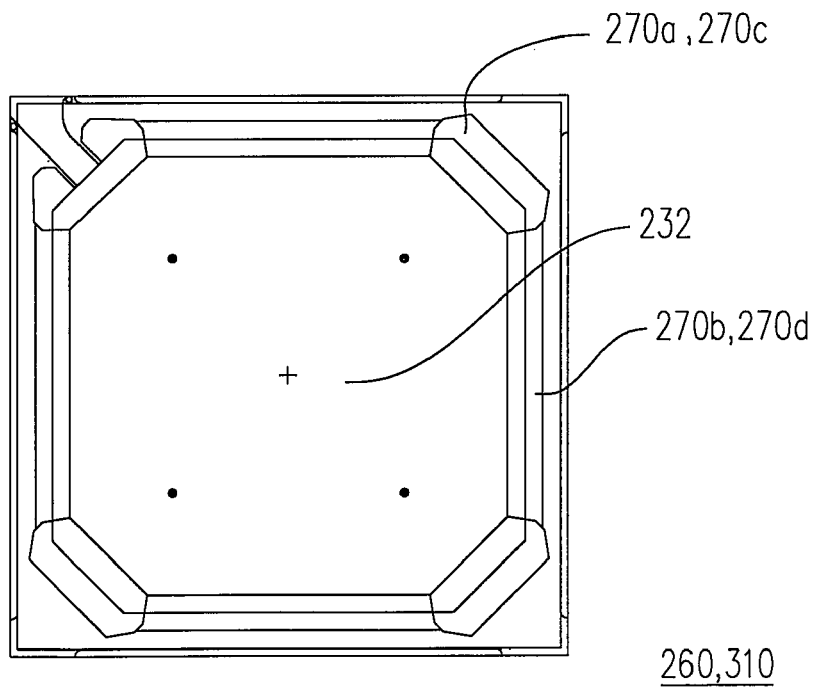

It should be noted that the number of the dummy trace 226 is not limited to one in the present invention, and there can be a plurality of dummy traces 226 to further reduce the probability of the traces 222 being pulled apart by the stress. In one embodiment, the dummy trace 226 and a portion of the traces 222 are located at a corner of the encapsulant disposing area 232, for example, located at a dummy trace disposing area 270a in FIG. 3A. In other words, the corner of the area covered by the encapsulant 250 can still be used to dispose the traces 222. Therefore, compared with the other conventional art, the present invention has a larger trace layout space. However, it is not limited that the dummy trace 226 and the traces 222 are located at the corner of the encapsulant disposing area 232 in the present invention, and in other embodiments, the dummy trace 226 can also be disposed between two adjacent corners of the encapsulant disposing area 232, for example, disposed on a dummy trace disposing area 270b in FIG. 3B. Alternatively, the dummy traces 226 are disposed at a corner of the encapsulant disposing area 232 and between two adjacent corners, for example, the dummy traces 226 and the traces 222 are disposed on the dummy trace disposing areas 270a and 270b in FIG. 3B. In other words, in the present invention, the dummy trace 226 can be disposed at a position where the trace is likely to be pulled apart by the stress depending on practical requirements.

The Second Embodiment

Figure 4A:
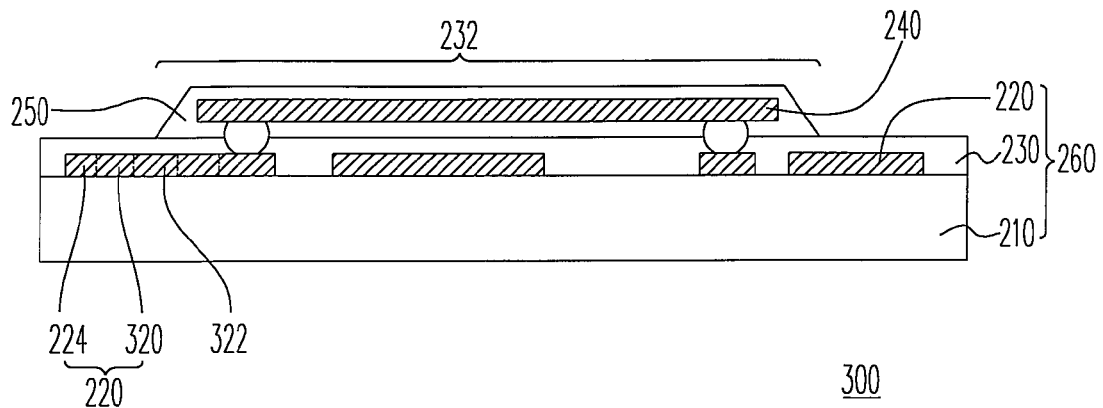
FIG. 4A is a schematic sectional view of a chip package structure having a circuit board according to the second embodiment of the present invention.
Figure 4B:
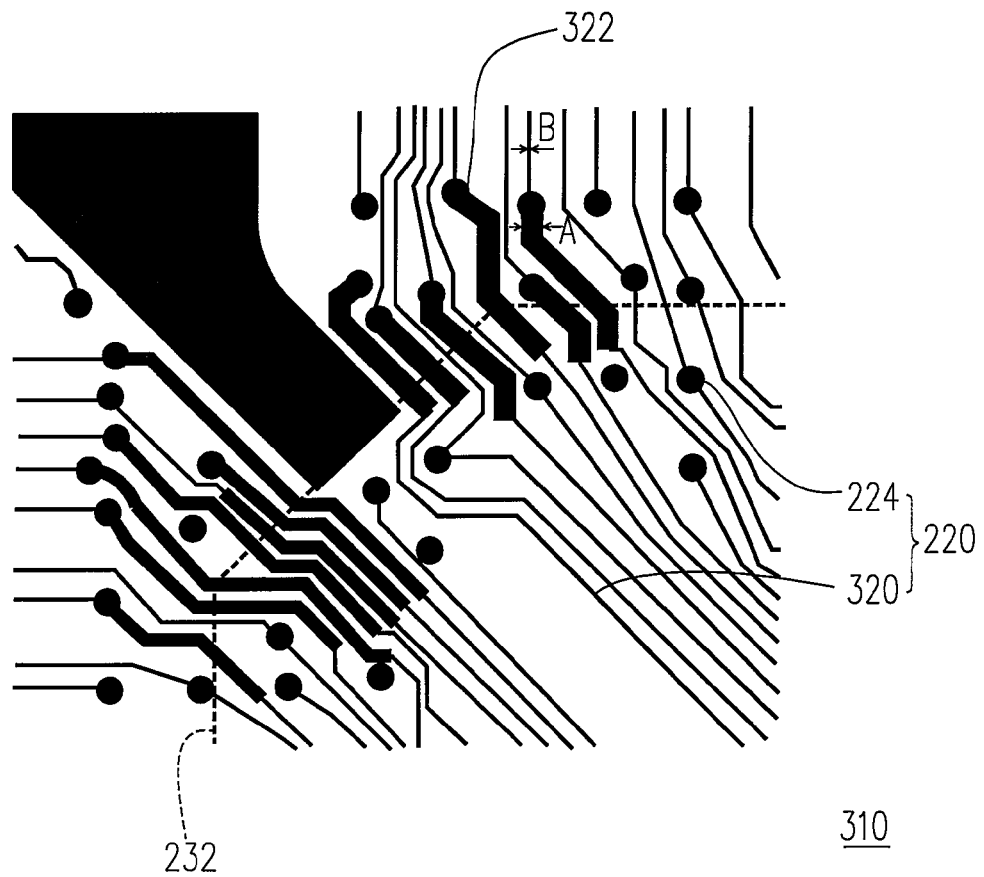
FIG. 4B is a schematic top view of a corner of the circuit board according to the second embodiment of the present invention.

FIG. 4A is a schematic sectional view of a chip package structure having a circuit board according to a second embodiment of the present invention, and FIG. 4B is a schematic top view of a corner of the circuit board according to the second embodiment of the present invention. Referring to FIGS. 4A and 4B, a chip package structure 300 and a circuit board 310 thereof in the second embodiment are substantially the same as the chip package structure 200 and the circuit board 260 thereof in the first embodiment respectively, except that the chip package structure 300 and the circuit board 310 thereof do not have the dummy trace 226, but one trace 320 has an enlarged section 322 instead. A line width A of the enlarged section 322 of the trace 320 is larger than a line width B of the other portion of the trace 320.

Since the enlarged section 322 increases the contact area of the circuit layer 220 and the substrate 210, in which the circuit layer 220 is disposed between the encapsulant 250 at edge of the encapsulant disposing area 232 and the substrate 210, the ability of the trace 320 for resisting the stress is increased, thereby reducing the probability of the trace 320 being pulled apart by the stress.

It should be noted that it is not limited in the present invention that only one trace 320 has the enlarged section 322, and a plurality of traces 320 may have enlarged sections 322. In an embodiment, the enlarged section 322 is located at a corner of the encapsulant disposing area 232, for example, in an enlarged section disposing area 270c in FIG. 3A. In other words, the corner of the area covered by the encapsulant 250 can still be used to dispose the trace 320. Therefore, compared with the other conventional art, the present invention has a larger trace layout space. However, it is not limited in the present invention that the enlarged section 322 is located at the corner of the encapsulant disposing area 232. In other embodiments, the enlarged section 322 can also be disposed between two adjacent corners of the encapsulant disposing area 232, for example, disposed on an enlarged section disposing area 270d in FIG. 3B. Alternatively, the enlarged sections 322 are disposed at a corner of the encapsulant disposing area 232 and between two adjacent corners. For example, the enlarged sections 322 are disposed in the enlarged section disposing areas 270c and 270d in FIG. 3B. In other words, in the present invention, the enlarged section 322 can be disposed at a position where the trace 320 is likely to be pulled apart by the stress depending on practical requirements.

Figure 4C:
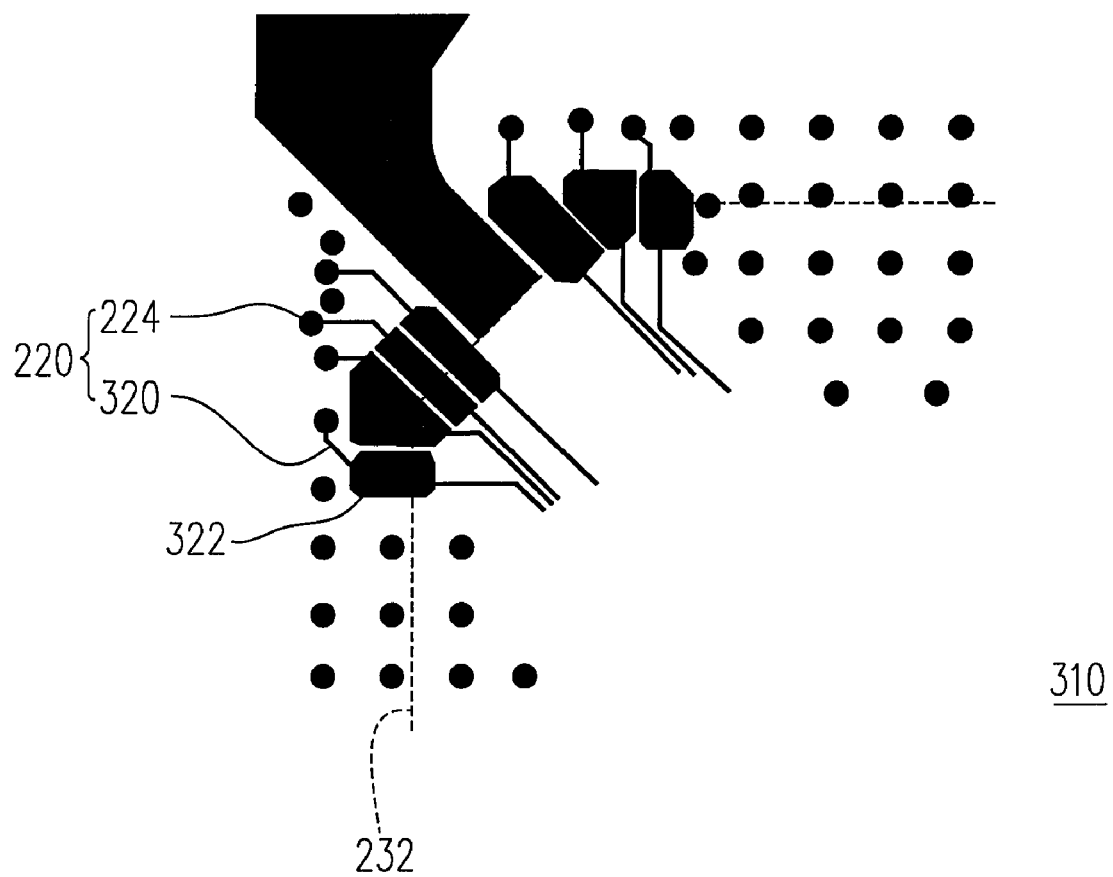
FIG. 4C is a schematic top view of a corner of the circuit board of another profile according to the second embodiment of the present invention.

Moreover, the profile of the enlarged section 322 and the position of the via holes 224 as shown in FIG. 4B are suitable for products requiring electrical consideration. It is not limited in the present invention that the profile of the enlarged section 322 and the position of the via holes 224 must be the same as those shown in FIG. 4B, and can be varied depending on practical requirement. For example, for products that do not require the electrical consideration, the profile of the enlarged section 322 and the position of the via holes 224 can refer to those shown in FIG. 4C.

Figure 5:
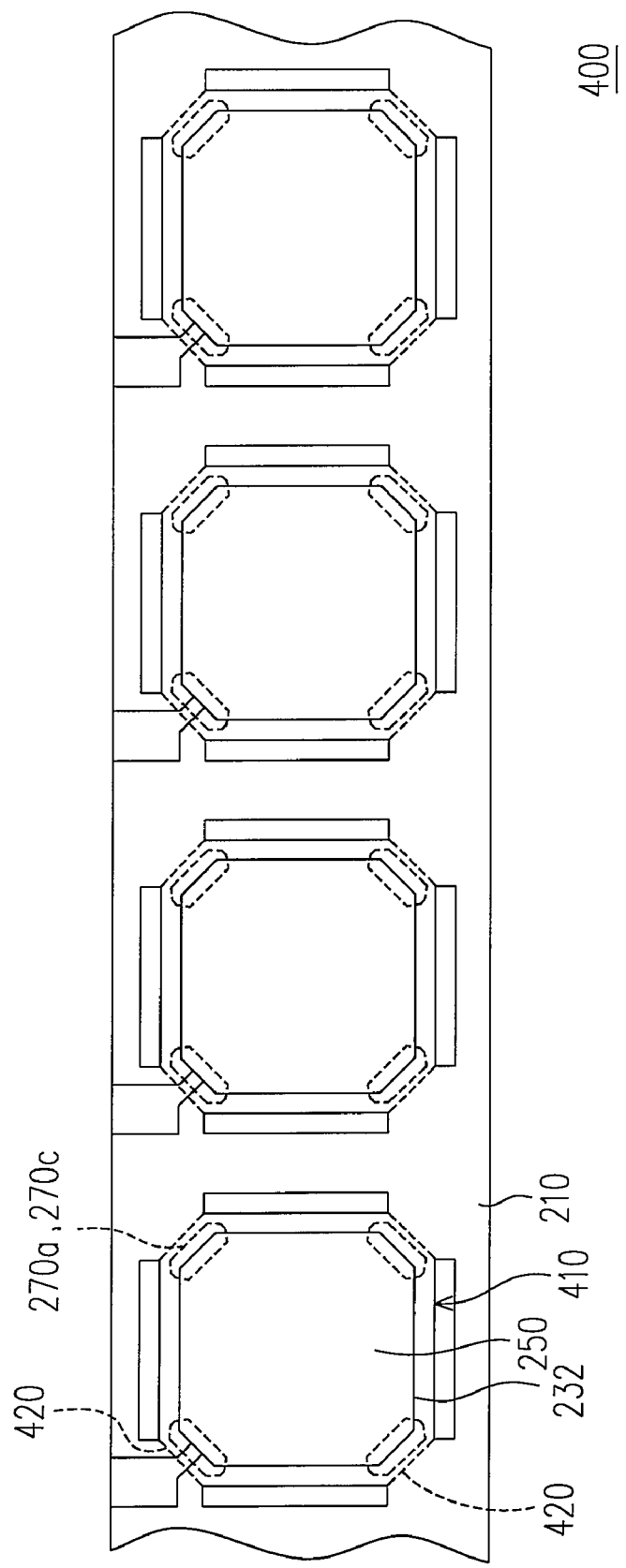
FIG. 5 is a schematic view of a batch of chip package structures without being punched during the process of the chip package structures according to an embodiment of the present invention.

FIG. 5 is a schematic view of a batch of chip package structures without being punched during the process of the chip package structures according to an embodiment of the present invention. Referring to FIG. 5, a batch of chip package structures 400 without being punched has a plurality of punch holes 410 on the substrate 210. After the fabrication of the batch of the chip package structures 400 without being punched is finished, a batch of chip package structures 400 is then punched into a plurality of chip package structures 200 (shown in FIG. 2A) or chip package structures 300 (shown in FIG. 4A) along a scribe line 420 on the substrate 210. During the punch process, the traces 222, 320 at the corners of the encapsulant disposing area 232 endure larger stress and the probability of the traces 222, 320 being pulled apart is increased. In the first embodiment and the second embodiment of the present invention, the dummy trace 226 and the enlarged section 322 are respectively disposed on the dummy trace disposing area 270a and the enlarged section disposing area 270c, and thus the probability of the traces 222, 320 being pulled apart by the stress generated by punching can be reduced.

In view of the above, the chip package structure and circuit board thereof according to the present invention adopt the dummy trace or the enlarged section of the trace, so the capability of the trace for resisting the stress generated by removing redundant encapsulant or by punch is increased, thereby reducing the probability of the trace being pulled apart by the stress. Moreover, in the chip package structure of the present invention, the corner of the area covered by the encapsulant can still be used to dispose the traces. Therefore, compared with the other conventional art, the present invention has a larger trace layout area.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board, comprising:
   a substrate;
   a circuit layer, disposed on the substrate, and the circuit layer comprising a trace, wherein the trace has an enlarged section, and a line width of the enlarged section is larger than a line width of the other portion of the trace; and
   a solder mask, covering the circuit layer and the substrate, and the solder mask having an encapsulant disposing area for carrying an encapsulant, wherein the enlarged section extends from the inside of the encapsulant disposing area to the outside of the encapsulant disposing area, wherein the enlarged section is located at all the corners of the encapsulant disposing area.

2. A chip package structure, comprising:
   a substrate;
   a circuit layer, disposed on the substrate, and the circuit layer comprising a trace, wherein the trace has an enlarged section, and a line width of the enlarged section is larger than a line width of the other portion of the trace;
   a solder mask, covering the circuit layer and the substrate;
   a chip, located on the solder mask, and electrically connected to the trace; and
   an encapsulant, covering the solder mask, and wrapping the chip, wherein the enlarged section extends from the inside of an area covered by the encapsulant to the outside of the area covered by the encapsulant, wherein the enlarged section is located at all the corners of the area covered by the encapsulant.

* * * * *